United States Patent [19]

Nakata et al.

[11] Patent Number: 4,547,751

[45] Date of Patent: Oct. 15, 1985

[54] SYSTEM FOR FREQUENCY MODULATION

[75] Inventors: Yukio Nakata, Kawasaki; Osamu Shiotsu, Ageo, both of Japan

[73] Assignees: Hitachi, Ltd.; Yagi Antenna Co., Ltd., both of Tokyo, Japan

[21] Appl. No.: 492,218

[22] Filed: May 6, 1983

[30] Foreign Application Priority Data

May 7, 1982 [JP] Japan .................................. 57-75200

[51] Int. Cl.[4] ............................................... H03C 3/00

[52] U.S. Cl. ................................ 332/16 R; 332/9 R; 375/62

[58] Field of Search ................. 332/9 R, 16 R, 18, 21, 332/23 R; 375/9, 23, 45, 62, 65, 68, 69, 70

[56] References Cited

U.S. PATENT DOCUMENTS

| | | | |
|---|---|---|---|
| 3,594,501 | 7/1971 | Sosin et al. | 375/65 X |
| 3,713,017 | 1/1973 | Vena | 332/9 R |
| 4,090,135 | 5/1978 | Farstad et al. | 375/45 |
| 4,368,439 | 1/1983 | Shibuya et al. | 375/62 X |

FOREIGN PATENT DOCUMENTS

| | | | |
|---|---|---|---|
| 0071968 | 6/1977 | Japan | 332/16 R |
| 0132964 | 11/1978 | Japan | 332/16 R |
| 0037002 | 3/1980 | Japan | 332/16 R |

OTHER PUBLICATIONS

Anon., "Continuous-Phase Frequency-Shift-Keyed Generator", Computer Design, vol. 16, No. 2, (Feb. 1977), p. 118.

Anon., "Synchronous FSK", Elektor, Jul./Aug. 1980.

*Primary Examiner*—Eugene R. LaRoche
*Assistant Examiner*—Robert J. Pascal
*Attorney, Agent, or Firm*—Antonelli, Terry & Wands

[57] ABSTRACT

A system for frequency modulation which generates first and second signals having different frequencies in a switching manner in accordance with the logical value of an input signal. The system includes an oscillator for generating a signal having a predetermined frequency; first and second frequency-dividers for subjecting the signal generated by the oscillator to frequency division by different integers l and m to generate first and second signals which are synchronized with each other; a third frequency-divider for subjecting an output signal from said second frequency-divider to frequency division by an integer n selected so that the product m×n is the least common multiple of l and m; a control device for controlling input data with an output signal from said third frequency-divider; and a switching device for selecting one of the output signals from the first and second frequency-dividers in accordance with the logical value of an output signal from the control device to generate an output which is passed through a filter for providing a modulated output.

8 Claims, 7 Drawing Figures

201
202
203
204
205
F0
F1
Din
Dout
Mout
T1
TIME

401
Fosc
402
F0
403
F1
404
FT
405
Din
406
Ds
407
Dout
408
Mout
T1
T2
TIME

SYSTEM FOR FREQUENCY MODULATION

BACKGROUND OF THE INVENTION

1. Field of the Invention

The present invention relates to a frequency modulation system which assigns different frequencies $f_0$ and $f_1$ to logical values 0 and 1 and generates signals having those two frequencies in a switching manner in accordance with the logical value of an input.

2. Description of the Prior Art

FIG. 1 is a block diagram showing a system for frequency modulation according to the prior art. An oscillator 101 generating an output $F_0$ of a frequency $f_0$ corresponding to the logical value 0 has its output terminal connected to an input terminal 104 of a switching device 103, whereas an oscillator 102 generating an output $F_1$ of a frequency $f_1$ corresponding to the logical value 1 has its output terminal connected to an input terminal 105 of the switching device 103. Input data Din to the modulation system is applied directly to a switching input terminal 106 of the switching device 103. Output data $D_{out}$ from an output terminal 107 of the switching device 103 is applied to a filter 108 limiting its frequency band, the output of which becomes a modulated output $M_{out}$.

The output signal $F_0$ from the oscillator 101 and the output signal $F_1$ from the oscillator 102 are not synchronized with each other. Because the input data $D_{in}$ to the modulation system is applied to the switching input terminal 106 of the switching device 103, the output of the switching device 103 is switched between signal $F_1$ and signal $F_0$ independently of the respective phases of signals $F_0$ and $F_1$ in accordance with changes in the input signal $D_{in}$ to the modulation system.

FIG. 2 illustrates the waveforms at different parts of the modulation system shown in FIG. 1. In FIG. 2, reference numerals 201 and 202 respectively show output signals $F_0$ and $F_1$ of the oscillators 101 and 102, numeral 203 the input signal $D_{in}$, numeral 204 the output signal $D_{out}$ from the switching device 103, and numeral 205 the output signal $M_{out}$ from the filter 108. The signal waveforms of the different parts when an input data $D_{in}$ having the waveform illustrated by 203 in FIG. 2 is applied to the switching input terminal 106 of the switching device 103 are illustrated by 201, 202, 204, and 205. The input signal $D_{in}$ 203 changes from logical value 0 to logical value 1 at a time $T_1$. The output signal from the switching device 103 is switched by that input data $D_{in}$. More specifically, before time $T_1$ signal $F_0$, the waveform of which is illustrated by 201, is generated as the output signal 107 from the switching device 103, and after time $T_1$ signal $F_1$, the waveform of which is illustrated by 202, is generated. In other words, since the signals $F_0$ and $F_1$ and the input data $D_{in}$ to the input terminal 106 of the switching device 103 are not synchronized with each other, the output signal $D_{out}$ from the output terminal 107 of the switching device 103 has a waveform whose phase changes abruptly at time $T_1$, as shown by 204. The modulated signal $M_{out}$, which is obtained by filtering the output signal 204 through the filter 108, has a waveform whose amplitude and phase are very distorted in the vicinity of time $T_1$, as shown by 205 in FIG. 2. Because of the incompleteness of this modulation system, the time during which there is an indefinite output during the interchange between the logical values 1 and 0 is extended in the prior art within a predetermined band width at the demodulator, so that the bit rate obtainable is lower than the theoretical value determined by the band width. In other words, in order to obtain a predetermined bit rate and bit error rate, it is necessary in the prior art to enlarge the band width of the transmission line sufficiently more than the theoretical value.

SUMMARY OF THE INVENTION

It is, therefore, an object of the present invention to provide a modulation system for generating a modulated signal whose phase does not change abruptly when the frequency is switched.

In order to achieve the above object, the present invention is characterized in that the signal $F_1$ with the frequency $f_1$ corresponding to the logical value 1 and the signal $F_0$ with the frequency $f_0$ corresponding to the logical value 0 are synchronized with each other, and in that the frequency of the output is switched only at an instant when the phase of the signals $F_1$ and $F_0$ are coincident.

DESCRIPTION OF THE PREFERRED EMBODIMENTS

The present invention will be described in more detail in the following in connection with the embodiments thereof with reference to the accompanying drawings.

Figure 1:
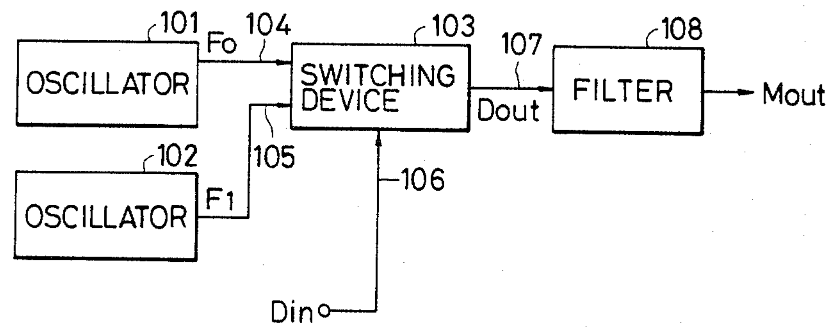
FIG. 1 is a block diagram showing the construction of a modulation system according to the prior art.
Figure 3:
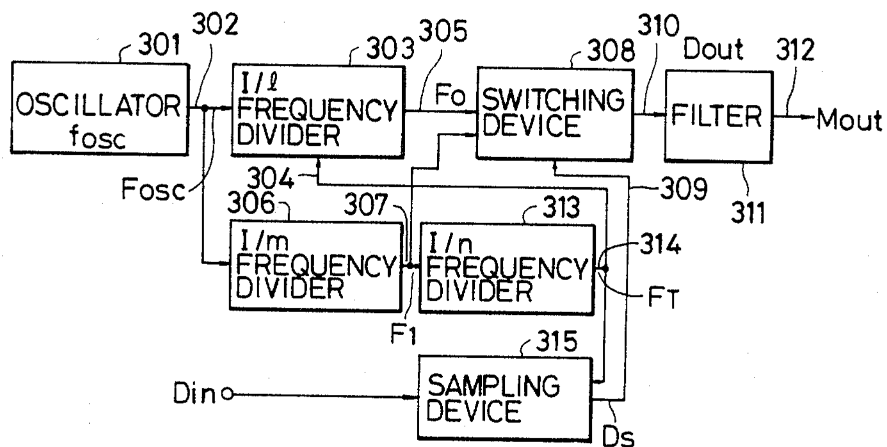
FIG. 3 is a block diagram showing one embodiment of the modulation system according to the present invention.
Figure 2:
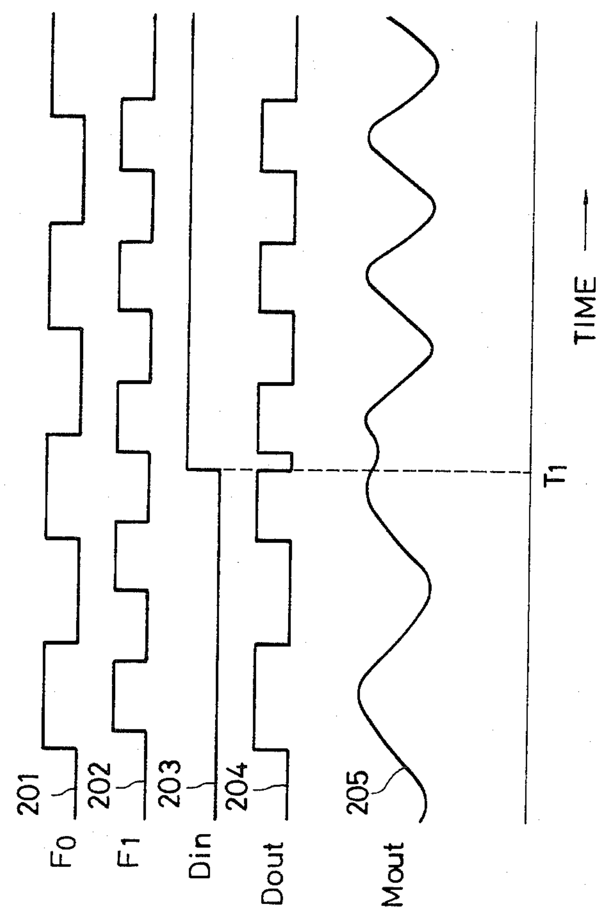
FIG. 2 is a timing chart illustrating the example of the operations of the modulation system of FIG. 1.

FIG. 3 shows one embodiment of the modulation system according to the present invention. As shown in FIG. 3, the output $F_{osc}$ of an output terminal 302 of an oscillator 301 with an oscillatory frequency $f_{osc}$ is applied to input terminals of a 1/l frequency divider 303 and a 1/m frequency divider 306. An output signal $F_0$ with a frequency $f_0=f_{osc}\times 1/l$ from an output terminal 305 of the 1/l frequency divider, and an output signal $F_1$ with a frequency $f_1=f_{osc}\times 1/m$ from an output terminal 307 of the 1/m frequency divider are each applied to the input terminals of a switching device 308. The frequency of the output signal $F_1$ is further divided by n by the action of a 1/n frequency divider 313. The value of n is the smallest integer such that the product $m\times n$ is a multiple of the integer l. A timing signal $F_T$ at an output terminal 314 of the 1/n frequency divider 313, which has a frequency $f_T=f_1\times 1/n=f_{osc}\times 1/mn$ which is obtained by dividing the frequency of the output signal $F_1$ by n in the 1/n frequency divider 313, is input to a sampling device 315 and a reset input terminal 304 of the 1/l frequency divider 303. Input data $D_{in}$, which has been sampled by the sampling device 315 in response to the timing signal $F_T$, is input to a switching input terminal of the switching device 308. A signal $D_{out}$ from a terminal 310 of the switching device 308 is applied through a filter 311 to an output terminal 312 to generate a modulated output $M_{out}$.

Figure 4:
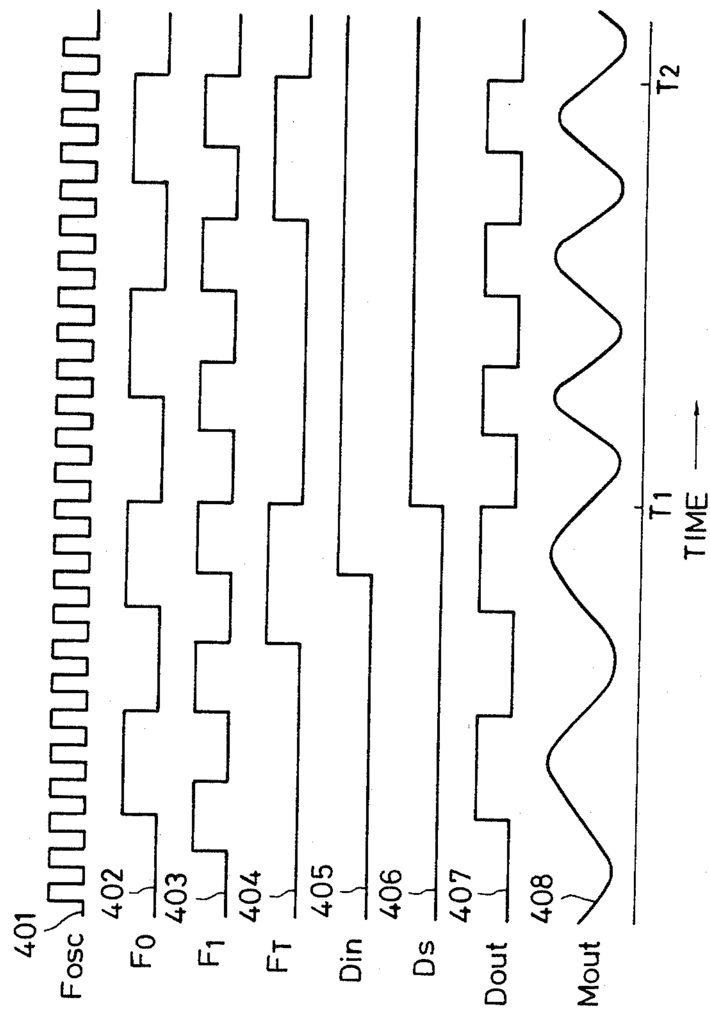
FIG. 4 is a timing chart illustrating one example of the operations of the modulation system of FIG. 3.

FIG. 4 illustrates the signal waveforms of the different parts of the modulation system of FIG. 3 when $l=6, m=4$ and $n=3$. In FIG. 4, reference numeral 401 illustrates the output signal $F_{osc}$ from the oscillator 301, numerals 402 and 403 the output signals $F_0$ and $F_1$ of the 1/l frequency divider 303 and the 1/n frequency divider 313, respectively, numeral 404 the output signal $F_T$ from the 1/n frequency divider 313, numeral 405 the input data $D_{in}$, numeral 406 an output signal $D_s$ from the sampling device 315, numeral 407 the output signal $D_{out}$ from the switching device 308; and numeral 408 the output signal $M_{out}$ from the filter 311. Both output signals $F_0$ and $F_1$ of the 1/l frequency divider 303 and the 1/m frequency divider 306, which are illustrated by 402 and 403 respectively in FIG. 4, are prepared by dividing the frequency of the output signal $F_{osc}$ of the same oscillator 301 illustrated by, 401 in FIG. 4, so that they are synchronized with each other. Since the ratio of the frequency $f_0$ of signal $F_0$ to the frequency $f_1$ of signal $F_1$ is set at 2:3, the signals $F_0$ and $F_1$ are in phase with each other every two cycles of the signal $F_0$ and every three cycles of the signal $F_1$. In short, the two signals $F_0$ and $F_1$ fall simultaneously with each other. Specifically, the timing signal $F_T$, which is obtained by dividing the frequency of the signal $F_1$ by n, i.e., three, falls once every three cycles of the signal $F_1$. The 1/l frequency divider 303 is reset by the timing signal $F_T$ thus obtained. In other words, when the timing signal $F_T$ falls, the output of the 1/l frequency divider 303 is also made to fall. As a result, when the timing signal $F_T$ falls, both signals $F_0$ and $F_1$ fall, which makes their phases coincident with each other. Similar results can be obtained by resetting the 1/n frequency divider 306 by detecting when both the outputs of the 1/l frequency divider 303 and the 1/m frequency divider 306 falls.

The operations will be described in the following by taking as an example the case in which the data $D_{in}$ having a waveform illustrated by 405 in FIG. 4 is input to the modulation system. The input data $D_{in}$ is sampled by the sampling device 315, when the timing signal $F_T$ illustrated by 404 in FIG. 4 falls, so that a sampled value is generated at the output terminal of the sampling device 315. The signal thus generated at the output terminal of the sampling device 315 holds its value until the next time the timing signal $F_T$ falls. As a result, the signal $D_s$, which is obtained by sampling the input data $D_{in}$ with the timing signal $F_T$, has a waveform the value of which can change, as illustrated by 406 in FIG. 4, only when the timing signal $F_T$ falls. In the example under discussion, the value of the signal $D_s$ changes from 0 to 1 at time $T_1$ so that the signal generated at the output terminal 310 of the switching device 308 is switched from the signal $F_0$ to the signal $F_1$ at the time $T_1$ in accordance with the change in the signal $D_s$. At time $T_1$, the phases of both signals $F_0$ and $F_1$ are at 0 (i.e., at the fall) so that the output signal $D_{out}$ obtained from the switching device 308 has a waveform such that its phase has no discontinuity even at the frequency change, as illustrated by 407 in FIG. 4. Thus, the modulated signal $M_{out}$, which is obtained by filtering the output signal $D_{out}$ from the switching device 308 through the filter 310, becomes a signal that always has a predetermined amplitude, has no abrupt change in phase, and has little distortion, as illustrated by 408 in FIG. 4. As a result, at the demodulator, the transient period of time during the interchange between the logical values 1 and 0 is so reduced that a higher bit rate than that of the prior art can be obtained within a predetermined band width .

Since there are no unnecessary spectral components, and, thus, the power ratio occupied by the signal component in the signal wave is increased , the S/N ratio can be increased on the reception side.

Figure 5:
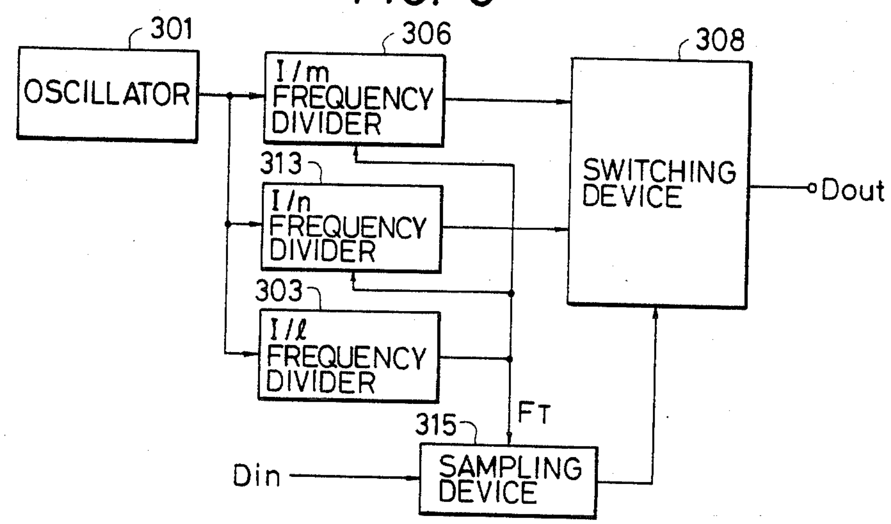
FIGS. 5 to 7 are block diagrams each showing other embodiments of the modulation system according to the present invention.

FIG. 5 is a block diagram showing another embodiment of the modulation system according to the present invention. In this embodiment, the input data $D_{in}$ is sampled by the output signal of the 1/l frequency divider 303, and the 1/m frequency divider 306 and the 1/n frequency divider 313 are reset. This time, incidentally, l is the least common multiple of the integers m and n.

Figure 6:
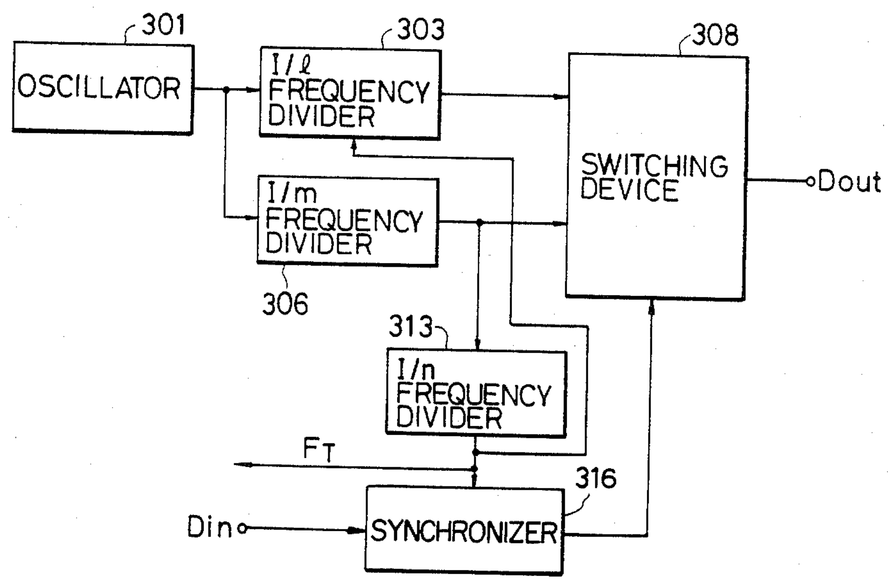

FIG. 6 is a block diagram showing a third embodiment of the modulation system according to the present invention. The 1/l frequency divider 303 is reset by the output signal of the 1/n frequency divider 313, and the timing signal $F_T$ is generated so that input data $D_{in}$ synchronized with that timing signal $F_T$ by a synchronizer 316 is input to the switching device 308. In this case, the multiple $m \times n$ is the least common multiple of both the integers m and l.

Figure 7:
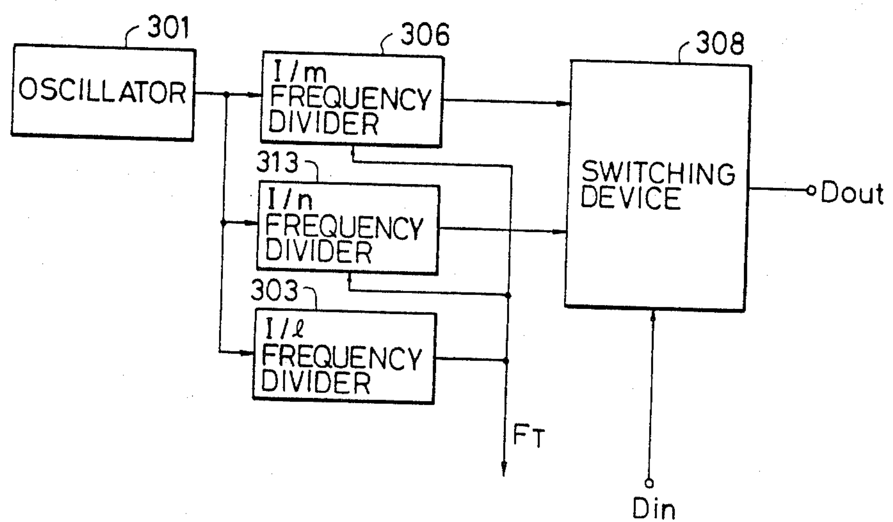

FIG. 7 is a block diagram showing a fourth embodiment of the modulation system according to the present invention. the 1/m frequency divider 306 and the 1/n frequency divider 313 are reset by the output of the 1/l frequency divider 303, and the timing signal $F_T$ is generated so that input data $D_{in}$ synchronized with the timing signal $F_T$ by a synchronizer 316 is input to the switching device 308. In this embodiment, l is the least common multiple of the integers m and n.

As has been described hereinbefore, according to the present invention it is possible to generate a FSK (i.e., Frequency Shift Keying) signal, the phase of which changes continuously even at the interchanges of the frequencies, and which has few unnecessary spectral components, thereby providing signals with a narrower band and higher quality than those of the prior art.

What is claimed is:

1. A system for frequency modulation, comprising: oscillating means for generating a signal having a predetermined frequency; first and second frequency-dividing means for subjecting the signal generated by said oscillating means to frequency division by different integers l and m and to generate first and second signals, respectively, which are synchronized with each other; third frequency-dividing means for subjecting an output signal from said second frequency-dividing means to frequency division by an integer n selected so that the product $m \times n$ is the least common multiple of l and m; control means for controlling input data in accordance with an output signal from said third frequency-dividing means; and switching means for selecting one of the output signals from said first and second frequency-dividing means in accordance with a logical value of an output signal from said control means to generate a frequency modulated output.

2. A system for frequency modulation according to claim 1, wherein said control means includes a sampling device for sampling the input data in accordance with the output signal from said third frequency-dividing means.

3. A system for frequency modulation according to claim 1, wherein said control means includes a synchronizer device for synchronizing the input data in accordance with the output signal from said third frequency-dividing means.

4. A system for frequency modulation according to claim 1, further comprising filter means for filtering the output of said switching means to provide a frequency modulated filtered frequency modulated output.

5. A system for frequency modulation, comprising: oscillating means for generating a signal having a predetermined frequency; first and second frequency-dividing means for subjecting the signal generated by said oscillatory means to frequency division by different integers m and n and to generate first and second signals, respectively; third frequency-dividing means for subjecting an output signal from said oscillatory means to frequency division by an integer l which is the least common multiple of integers m and n; control means for controlling input data in accordance with an output signal from said third frequency-dividing means; and switching means for selecting one of the output signals from said first and second frequency-dividing means in accordance with a logical value of an output signal from said control means to generate a frequency modulated output.

6. A system for frequency modulation according to claim 5, wherein said control means includes a sampling device for sampling the input data in accordance with the output signal from said third frequency-dividing means.

7. A system for frequency modulation according to claim 5, wherein said control means includes a synchronizer device for synchronizing the input data in accordance with the output signal from said third frequency-dividing means.

8. A system for frequency modulation according to claim 5, further comprising filter means for filtering the output frequency modulated of said switching means to provide a filtered frequency modulated output.

* * * * *